(12) United States Patent
Yuan et al.

(10) Patent No.: US 11,257,917 B2
(45) Date of Patent: Feb. 22, 2022

(54) GATE-ALL-AROUND (GAA) TRANSISTORS WITH ADDITIONAL BOTTOM CHANNEL FOR REDUCED PARASITIC CAPACITANCE AND METHODS OF FABRICATION

(71) Applicant: QUALCOMM Incorporated, San Diego, CA (US)

(72) Inventors: Jun Yuan, San Diego, CA (US); Peijie Feng, San Diego, CA (US); Stanley Seungchul Song, San Diego, CA (US); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/893,993

(22) Filed: Jun. 5, 2020

(65) Prior Publication Data
US 2021/0384310 A1 Dec. 9, 2021

(51) Int. Cl.
*H01L 29/423* (2006.01)
*H01L 21/8234* (2006.01)
*H01L 29/08* (2006.01)
*H01L 29/06* (2006.01)

(52) U.S. Cl.
CPC ......... *H01L 29/42392* (2013.01); *H01L 21/823412* (2013.01); *H01L 29/0673* (2013.01); *H01L 29/0847* (2013.01)

(58) Field of Classification Search
CPC ......... H01L 29/42392; H01L 29/78696; H01L 29/66795; H01L 29/78642; H01L 29/0673; H01L 29/0676
See application file for complete search history.

(56) References Cited

U.S. PATENT DOCUMENTS

| | | | |
|---|---|---|---|
| 7,176,041 B2 | 2/2007 | Lee et al. | |
| 9,023,713 B2 | 5/2015 | Illgen et al. | |
| 9,484,447 B2 | 11/2016 | Kim et al. | |
| 9,842,914 B1 | 12/2017 | Yeung et al. | |
| 10,541,305 B2 | 1/2020 | Then et al. | |
| 2013/0302955 A1 | 11/2013 | Vinet et al. | |
| 2017/0179299 A1* | 6/2017 | Bae | H01L 29/0673 |
| 2018/0294343 A1 | 10/2018 | Or-Bach et al. | |
| 2019/0287864 A1 | 9/2019 | Cheng et al. | |
| 2020/0020690 A1* | 1/2020 | Ando | H01L 29/0673 |
| 2020/0027959 A1 | 1/2020 | Cheng et al. | |

(Continued)

OTHER PUBLICATIONS

International Search Report and Written Opinion for International Patent Application No. PCT/US2021/029595, dated Jul. 16, 2021, 16 pages.

*Primary Examiner* — Changhyun Yi
(74) *Attorney, Agent, or Firm* — Qualcomm Incorporated

(57) ABSTRACT

Gate-all-around (GAA) transistors with an additional bottom channel for reduced parasitic capacitance and methods of fabricating the same include one or more channels positioned between a source region and a drain region. The one or more channels, which may be nanowire or nanoslab semiconductors, are surrounded by gate material. The GAA transistor further includes an additional semiconductor channel between a bottom section of a gate material and a silicon on insulator (SOI) substrate in a GAA transistor. This additional channel, sometimes referred to as a bottom channel, may be thinner than other channels in the GAA transistor and may have a thickness less than its length.

24 Claims, 8 Drawing Sheets

(56) References Cited

U.S. PATENT DOCUMENTS

2020/0083219 A1    3/2020  Kang et al.
2020/0118889 A1*   4/2020  Bao .................... H01L 27/0922
2021/0242327 A1*   8/2021  Lin ................. H01L 21/823431

* cited by examiner

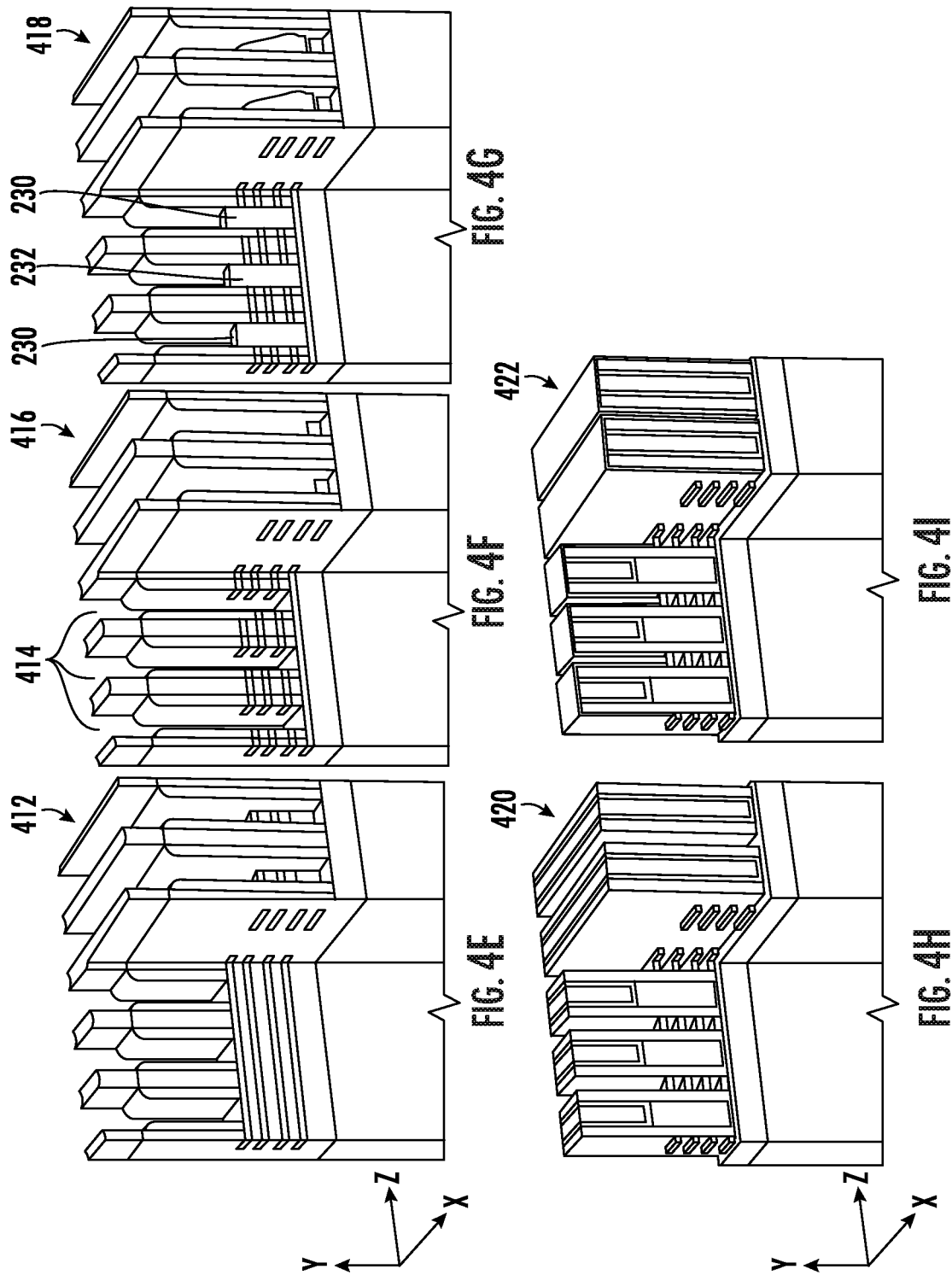

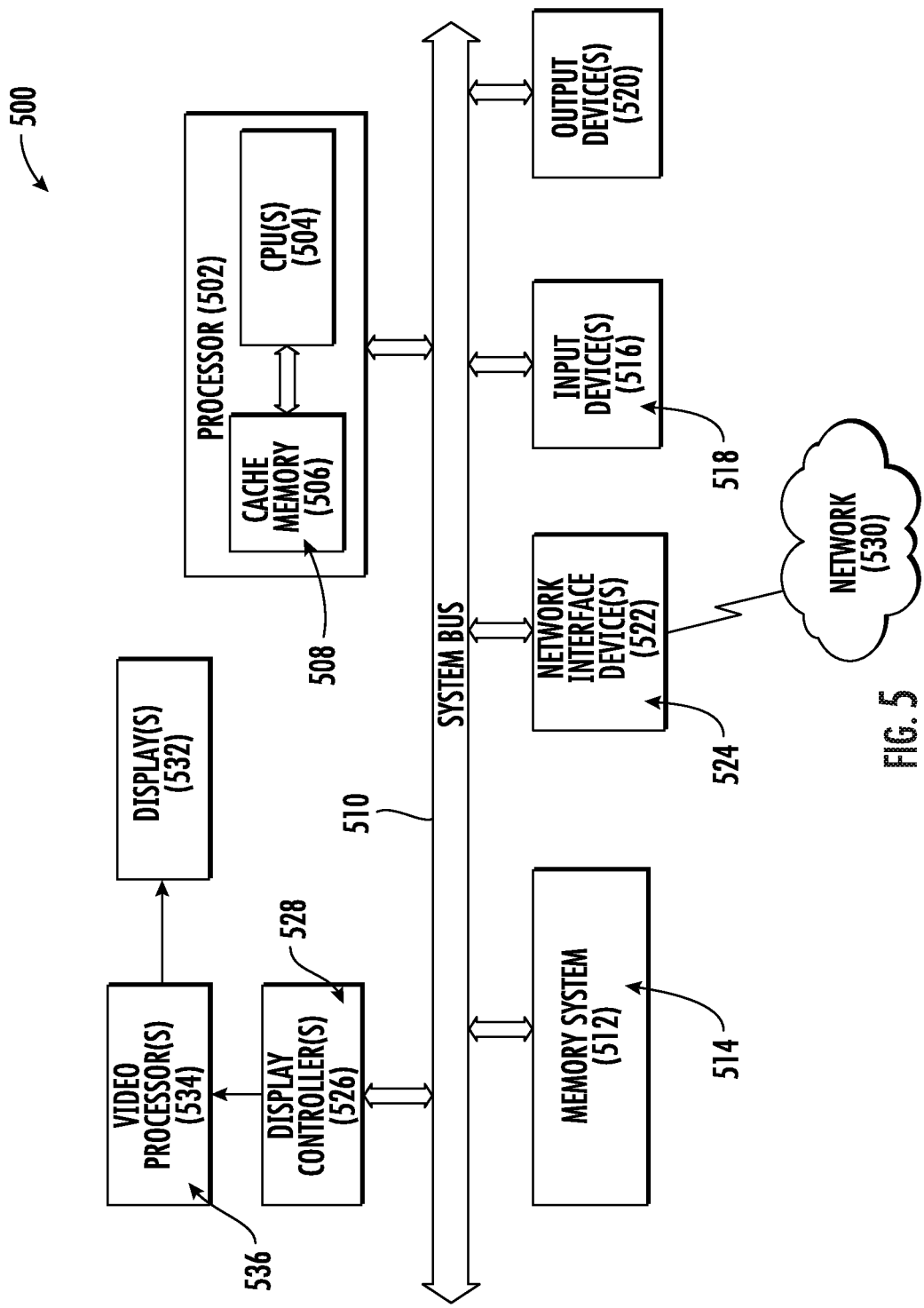

GATE-ALL-AROUND (GAA) TRANSISTORS WITH ADDITIONAL BOTTOM CHANNEL FOR REDUCED PARASITIC CAPACITANCE AND METHODS OF FABRICATION

BACKGROUND

I. Field of the Disclosure

The technology of the disclosure relates generally to semiconductor devices forming integrated circuits (ICs), and more specifically, to gate around transistors, such as gate-all-around (GAA) transistors (e.g., nanowire, nanoslab, nanosheet transistors).

II. Background

Transistors are essential components in modern electronic devices. Large numbers of transistors are employed in integrated circuits (ICs) in many modern electronic devices. For example, components such as central processing units (CPUs), graphics processing units (GPUs), and memory systems each employ a large quantity of transistors for logic circuits and memory devices. There is a desire to reduce the size of individual transistors to conserve die area so that more computing power may be made available in devices of the same size. The pressure to reduce size of transistors has led to the use of gate-all-around (GAA) transistors where a gate element surrounds a channel of the transistor. By providing a gate around the channel, control over the channel is improved, particularly for short channels, relative to other gate geometries. Further pressures to reduce size in such GAA transistors have caused the rise of parasitic capacitance, which may limit performance of the resulting transistor.

SUMMARY OF THE DISCLOSURE

Aspects disclosed in the detailed description include gate-all-around (GAA) transistors with an additional bottom channel for reduced parasitic capacitance and methods of fabricating the same. In exemplary aspects, a GAA transistor is provided. The GAA transistor includes one or more channels positioned between a source region and a drain region. The one or more channels, which may be nanowire, nanosheet, or nanoslab semiconductors, are surrounded by gate material. The GAA transistor further includes an additional semiconductor channel between a bottom section of a gate material and a silicon on insulator (SOT) substrate in the GAA transistor. This additional channel, sometimes referred to as a bottom channel, may be thinner than other channels in the GAA transistor and may have a thickness less than its length. By adding this bottom channel, the material that forms the gate for the GAA transistor is physically spaced away from the SOI substrate by at least the thickness of the bottom channel. This change in physical geometry causes the conductive portions to of the gate to be spaced from the conductive portions of the substrate, thereby reducing parasitic capacitance that may otherwise occur between the gate and the substrate in a GAA transistor device. Further, the size of the bottom channel may be chosen based on desired leakage current and ease of control over the channel.

In this regard in one aspect, an integrated circuit (IC) is disclosed. The IC includes a substrate comprising a top surface extending in a plane. The IC also includes an insulator layer positioned above and on the top surface of the substrate. The IC also includes a GAA transistor. The GAA transistor is positioned above and on the insulator layer. The GAA transistor has a vertical axis orthogonal to the plane, a lateral axis parallel to the plane, and a longitudinal axis parallel to the plane. The GAA transistor includes a first channel having a primary axis along the longitudinal axis. The first channel extends parallel to the plane and is positioned above the top surface of the substrate. The first channel includes a plurality of sides parallel to the primary axis. The first channel also includes a perimeter formed from the plurality of sides parallel to the primary axis of the first channel. The GAA transistor also includes a gate extending around the perimeter of the first channel, the gate including a bottom section. The bottom section of the gate is positioned vertically between the first channel and the insulator layer. The bottom section has a gate length parallel to the longitudinal axis. The GAA transistor also includes a bottom channel between the bottom section of the gate and the insulator layer. The bottom channel has a thickness along the vertical axis, the thickness less than or equal to one third of the gate length.

In another aspect, an IC is disclosed. The IC includes a substrate comprising a top surface extending in a plane. The IC also includes an insulator layer positioned above and on the top surface of the substrate. The IC also includes a GAA transistor. The GAA transistor is positioned above and on the insulator layer. The GAA transistor has a vertical axis orthogonal to the plane, a lateral axis parallel to the plane, and a longitudinal axis parallel to the plane. The GAA transistor includes a first channel having a primary axis along the longitudinal axis. The first channel extends parallel to the plane and is positioned above the top surface of the substrate. The first channel includes a first thickness along the vertical axis. The first channel also includes a plurality of sides parallel to the primary axis. The first channel also includes a perimeter formed from the plurality of sides parallel to the primary axis of the first channel. The GAA transistor includes a gate extending around the perimeter of the first channel. The gate includes a bottom section. The bottom section of the gate is positioned vertically between the first channel and the insulator layer. The GAA transistor also includes a bottom channel between the bottom section of the gate and the insulator layer. The bottom channel has a bottom channel thickness along the vertical axis. The bottom channel thickness is less than the first thickness.

In another aspect, a method of forming an IC is disclosed. The method includes forming a substrate with an insulator layer, the insulator layer having a planar top surface extending in a plane. The method also includes forming a GAA transistor, the GAA transistor positioned above and on the top surface of the insulator layer. The GAA transistor has a vertical axis perpendicular to the plane, a lateral axis parallel to the plane, and a longitudinal axis parallel to the plane. Forming the GAA transistor includes forming a bottom channel on the top surface of the insulator layer, the bottom channel having a bottom thickness. Forming the GAA transistor also includes forming a gate over the bottom channel, the gate having a gate length wherein the gate length is at least three times greater than the bottom thickness.

In another aspect, a method of forming an IC is disclosed. The method includes forming a substrate with an insulator layer, the insulator layer having a planar top surface extending in a plane. The method also includes forming a GAA transistor, the GAA transistor positioned above and on the top surface of the insulator layer. The GAA transistor has a vertical axis perpendicular to the plane, a lateral axis parallel to the plane, and a longitudinal axis parallel to the plane. Forming the GAA transistor includes forming a bottom channel on the top surface of the insulator layer, the bottom channel having a bottom thickness. Forming the GAA transistor also includes forming a gate over the bottom channel. Forming the GAA transistor also includes forming a first channel over the gate, the first channel having a first thickness greater than the bottom thickness.

BRIEF DESCRIPTION OF THE FIGURES

FIGS. 4A-4I are cross-sectional views of a GAA transistor device made by the process of FIG. 3 taken at different process steps;

FIG. 5 is a block diagram of an exemplary processor-based system that can include integrated circuits (ICs) that include a GAA transistor device(s) such as the GAA transistor device of FIG. 2.

DETAILED DESCRIPTION

Figures 1A, 1B:
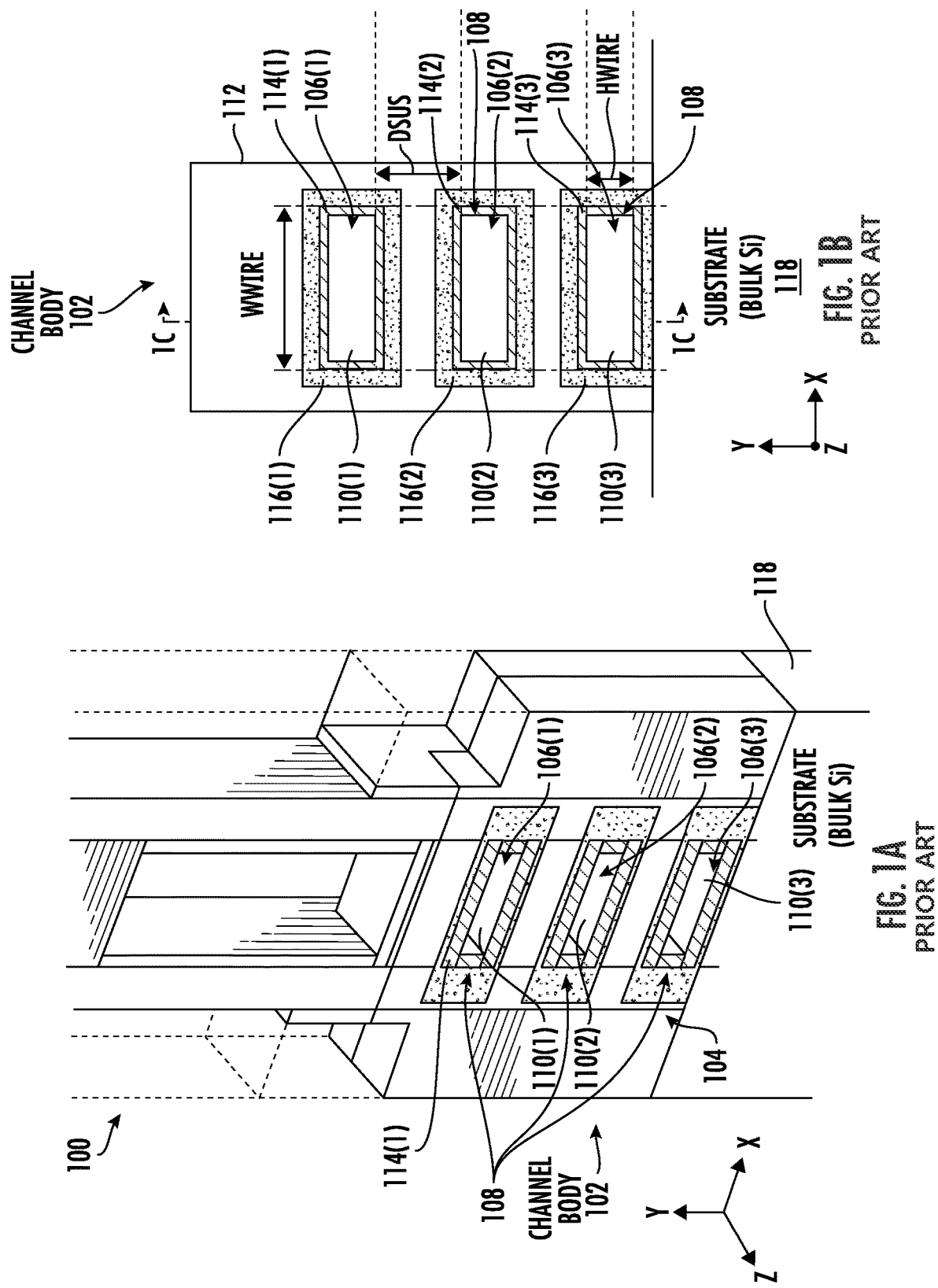
FIG. 1A is a perspective view of a conventional gate-all-around (GAA) transistor device.
FIG. 1B is a cross-sectional side view of the gate body of the GAA transistor device of FIG. 1A.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include gate-all-around (GAA) transistors with an additional bottom channel for reduced parasitic capacitance and methods of fabricating the same. In exemplary aspects, a GAA transistor is provided. The GAA transistor includes one or more channels positioned between a source region and a drain region. The one or more channels, which may be nanowire, nanosheet, or nanoslab semiconductors, are surrounded by gate material. The GAA transistor further includes an additional semiconductor channel between a bottom section of a gate material and a silicon on insulator (SOI) substrate in the GAA transistor. This additional channel, sometimes referred to as a bottom channel, may be thinner than other channels in the GAA transistor and may have a thickness less than its length. By adding this bottom channel, the material that forms the gate for the GAA transistor is physically spaced away from the SOI substrate by at least the thickness of the bottom channel. This change in physical geometry causes the conductive portions of the gate to be spaced from the conductive portions of the substrate, thereby reducing parasitic capacitance that may otherwise occur between the gate and the substrate in a GAA transistor device. Further, the size of the bottom channel may be chosen based on desired leakage current and ease of control over the channel.

Before addressing particular aspects of the present disclosure, an overview of a conventional GAA transistor device is provided with reference to FIGS. 1A-1C to highlight where parasitic capacitance may occur and provide context for the discussion of the present disclosure, which begins below with reference to FIG. 2. For convenience, an axis legend is supplied for each FIGS. 1A-2 and 4A-4I.

In this regard, FIGS. 1A and 1B illustrate perspective and side elevational views, respectively, of an exemplary transistor, which may be a field-effect transistor (FET) and more specifically is a nanowire gate-all-around (GAA) transistor 100. Note that while the GAA transistor 100 may be considered a GAA FET, it is referred to herein as just a GAA transistor. As shown in FIG. 1A, the GAA transistor 100 includes a channel body 102 that includes a nanowire channel structure 104 that includes a plurality of nanowire structures 106(1)-106(3) that form a collective channel 108. The plurality of nanowire structures 106(1)-106(3) are arranged in a vertically (i.e., along the Y-axis) stacked arrangement to increase channel current density for a given channel body 102 height, and thus increase the effective channel width for increased drive strength (i.e., drive current). In this example, the nanowire structures 106(1)-106(3) are nanoslabs 110(1)-110(3) that are longer in the horizontal (X-axis) direction than they are tall in the vertical (Y-axis) direction.

FIG. 1B illustrates a close-up, side elevational view of the channel body 102 in the GAA transistor 100 in FIG. 1A. As shown in FIG. 1B, a gate material 112 in the form of a metal material completely surrounds the nanowire structures 106(1)-106(3). Before the gate material 112 is disposed, an interfacial layer 114(1)-114(3) is disposed around the respective nanowire structures 106(1)-106(3) followed by a high-K dielectric material layer 116(1)-116(3) to insulate the gate material 112 from the nanowire structures 106(1)-106(3). Note that the interfacial layer and the high-K dielectric layer are visible in FIG. 1A, but reference characters are omitted to avoid cluttering FIG. 1A. Applying a voltage to the gate material 112 controls an electric field in the nanowire structures 106(1)-106(3) to cause current to flow through the nanowire structures 106(1)-106(3) during an active mode.

The height (in the Y-axis) of each of the nanowire structures 106(1)-106(3) is of a height Hwire in this example. Adjacent nanowire structures 106(1)-106(3) are separated a distance Dsus from each other as shown in FIG. 1B. This distance Dsus is provided to allow the gate material 112 to be disposed completely around and between the adjacent nanowire structures 106(1)-106(3) so that the gate material 112 can have greater electrostatic control of the collective channel 108 formed by the nanowire structures 106(1)-106(3) of the GAA transistor 100. The distance Dsus may be fourteen (14) nanometers (nm) as an example in a conventional nanowire channel structure, such as the nanowire channel structure 104.

The channel body 102 may be formed on top of (i.e., in the Y-direction) a substrate 118 such as a bulk silicon (Si) body.

Figure 1C:
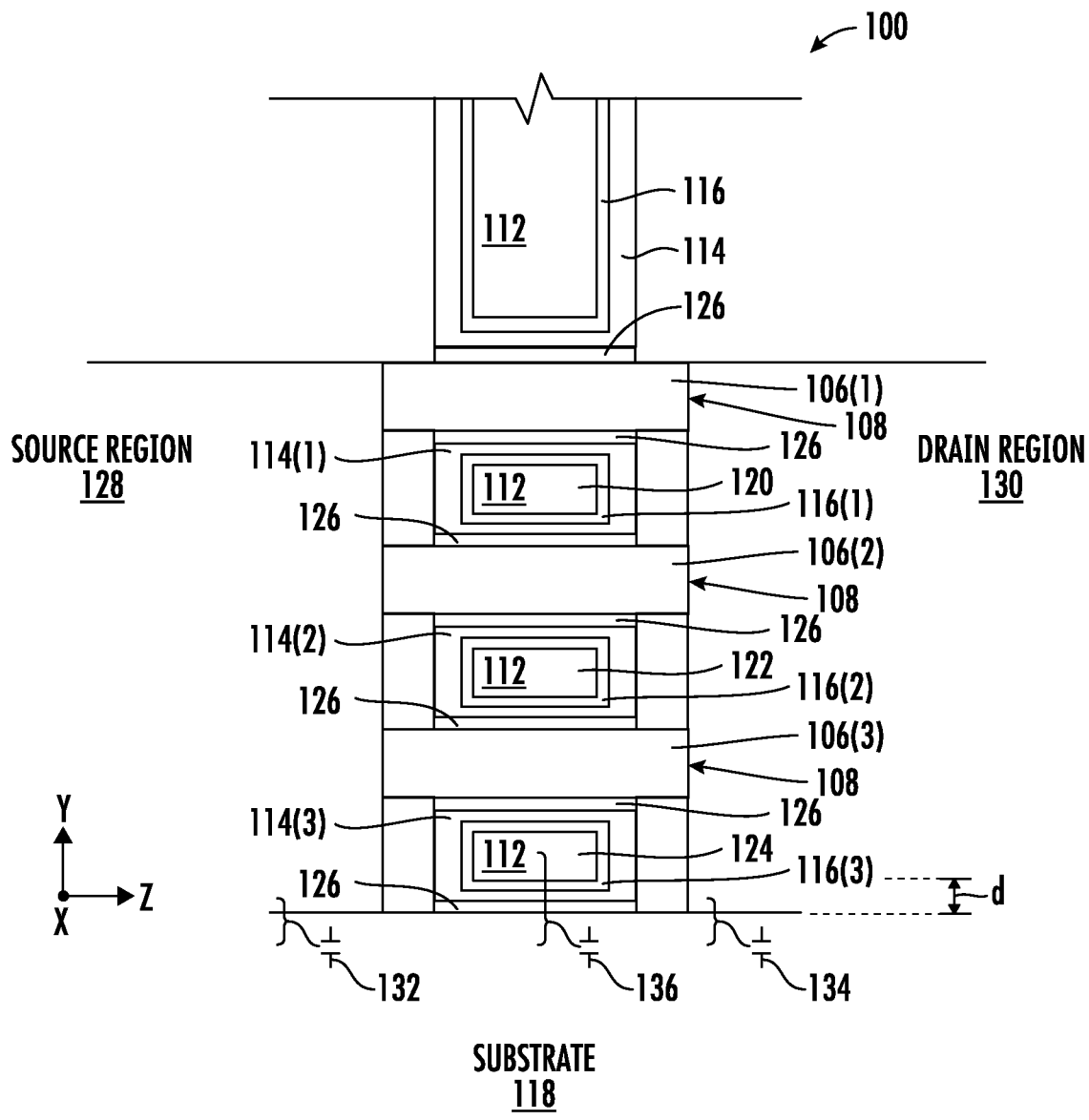
FIG. 1C is a cross-sectional side view of the gate body of the GAA transistor device of FIGS. 1A and 1B taken along the line 1C-1C of FIG. 1B.

FIG. 1C is a cross-sectional view of the channel body 102 taken along line 1C-1C of FIG. 1B. Because of the change in orientation, the nanowire structures 106(1)-106(3) forming the collective channel 108 now appear to sandwich the gate material 112 into a top gate section 120, middle gate section 122, and bottom gate section 124 (and may be referred to as a stack of gates even though it may be a unitary structure). It should be appreciated that each of the sections 120, 122, and 124 are made from the gate material 112 and are effectively a continuous structure (better seen in FIGS. 1A and 1B). The bottom gate section 124 is physically proximate the substrate 118 with only dielectric type materials therebetween. While not illustrated in FIGS. 1A and 1B, the nanowire structures 106(1)-106(3) abut insulating material 126, and the interfacial layers 114(1)-114(3) are positioned closer to the gate sections 120, 122, 124 than such insulating material 126. High-K dielectric material layers 116(1)-116(3) are directly adjacent the gate material 112.

With continued reference to FIG. 1C, it is now possible to see source region 128 and drain region 130. While the source region 128 is shown as being on the left side (using the Z-axis) of the collective channel 108 and the drain region 130 is shown as being on the right side of the collective channel 108, it should be appreciated that these may be switched without substantially changing the operation of the GAA transistor 100.

There may be parasitic capacitance 132 formed between the substrate 118 and the source region 128 and additional parasitic capacitance 134 formed between the drain region 130 and the substrate 118. Still further parasitic capacitance 136 may be formed between the bottom gate section 124 and the substrate 118. This capacitance is created by the metal of the gate material 112 acting as a first plate of a capacitor spaced by at least dielectric material 116(3) from the substrate 118, which acts as a second plate of the capacitor. The capacitance may be calculated from the area A of the "plates" and the space (d) between the plates according to the well understood equation:

$$C = \varepsilon_0 \frac{A}{d} \qquad \text{Equation 1}$$

where $\varepsilon_0$ is the electric constant ($\varepsilon_0 \approx 8.854 \times 10^{-12}$ F·m$^{-1}$). This parasitic capacitance may negatively impact performance, contribute to unwanted power consumption, and/or contribute to increased leakage current.

To reduce the parasitic capacitance 136 formed between the bottom gate section 124 and the substrate 118, exemplary aspects of the present disclosure provide a GAA transistor with a channel underneath the bottom gate section and above a section of a SOI substrate instead of a bulk silicon substrate. At the most basic, such changes increase d in the equation above, thereby reducing the capacitance. Control of the added channel is challenging since the gate will not surround the channel as is done with nanostructures 106(1)-106(3). Accordingly, the geometry of the new channel is controlled to facilitate control as is better explained below with reference to a GAA transistor 200 illustrated in FIG. 2.

In a first exemplary aspect, the SOI can be fully SOI (that is, the insulator is coextensive with the silicon substrate). In a second exemplary aspect, the SOI can limit the footprint of the insulator to just underneath the bottom channel.

Figure 2:
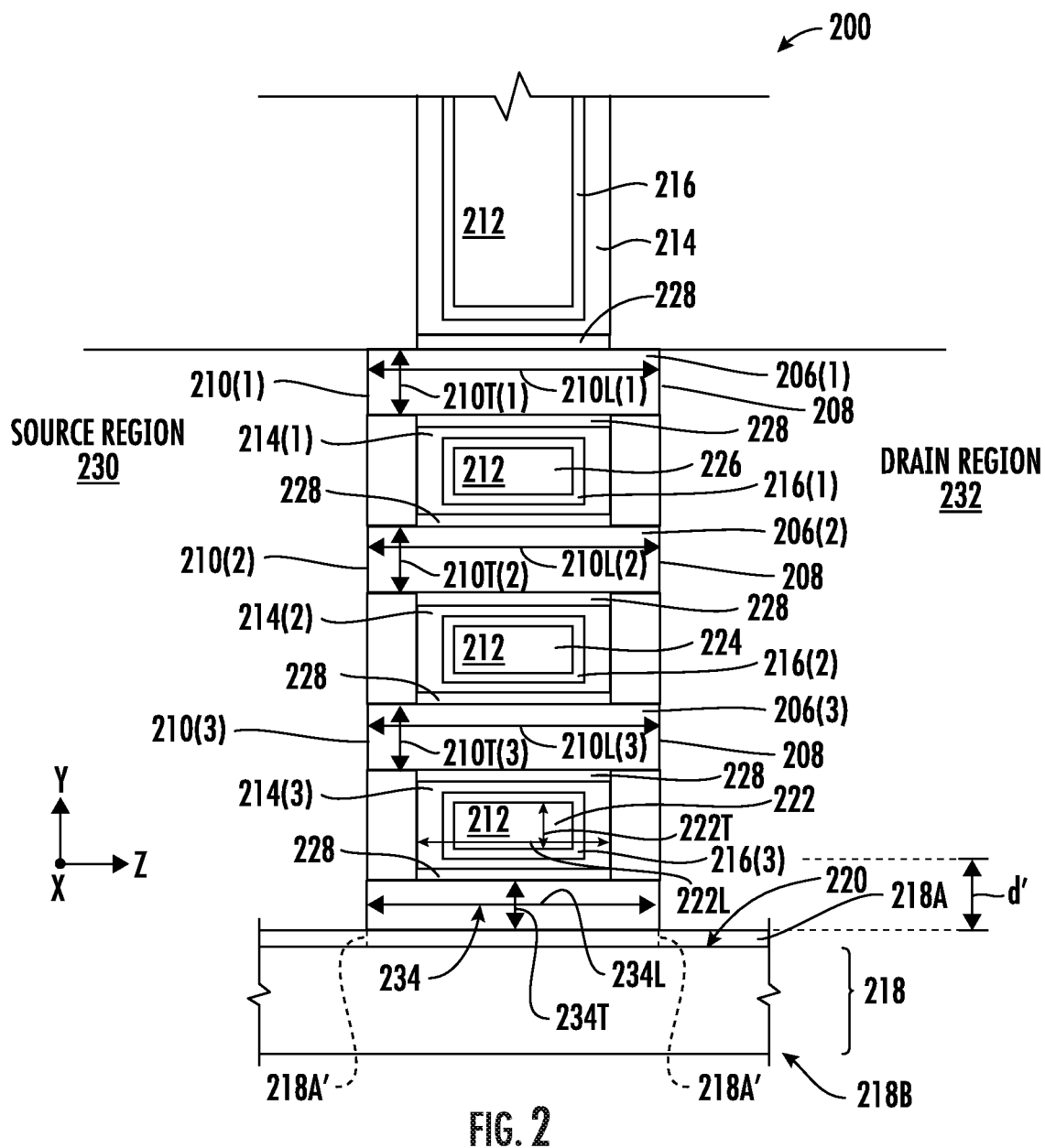
FIG. 2 is a cross-sectional side view of a GAA transistor device having a bottom channel between a gate and an insulator over the substrate to reduce parasitic capacitance according to an exemplary aspect of the present disclosure.

In this regard, FIG. 2 illustrates a GAA transistor 200, which, in an exemplary aspect is a metal oxide semiconductor field-effect transistor (MOSFET) having additional bottom channel to provide reduced parasitic capacitance. Thus, the GAA transistor 200 may also be referred to as a GAA FET. FIG. 2 is provided from the same perspective as FIG. 1C, with the X-axis extending into and out of the image, the Y-axis being the vertical axis, and the Z-axis being left to right (or right to left) of the image as labeled. As with the GAA transistor 100, the GAA transistor 200 includes nanowire, nanosheet, or nanoslab structures, generically nanostructures 206(1)-206(3) that form a collective channel 208, and more specifically, a top channel 210(1), a middle channel 210(2), and a bottom channel 210(3). Top, bottom, and middle are used with reference to the vertical or Y-axis. The channels 210(1)-210(3) each have a respective channel length 210L(1)-210L(3) along a primary or longitudinal axis (i.e., along the Z-axis). In an exemplary aspect, the channel lengths 210L(1)-210L(3) are uniform or identical and may be in a range from approximately eight to twenty nanometers (8-20 nm). Further, the channels 210(1)-210(3) each have a respective channel thickness 210T(1)-210T(3) along a vertical axis (i.e., along the y-axis). In an exemplary aspect, the channel thicknesses 210T(1)-210T(3) are uniform or identical and may be in a range from approximately twelve to forty (12-40) nm thick.

As used herein, approximately is defined to be within five percent (5%).

With continued reference to FIG. 2, gate material 212 surrounds at least a portion of the nanostructures 206(1)-206(3). In particular, the nanostructures 206(1)-206(3) have a perimeter formed from a plurality of sides (e.g., four), and the gate material 212 extends around this perimeter for at least a portion of the channel length 210L(1)-210L(3) along the Z-axis It should be appreciated that the gate material 212 is actually contiguous in that (similar to gate material 112 in FIGS. 1A, 1B) the gate material 212 extends vertically up and down the Y-axis when viewed from the ends on the X-axis (i.e., there is a vertical block of gate material 212 "behind" the image in FIG. 2 and another "in front of" the image in FIG. 2). High-K dielectric material layers 216(1)-216(3) are directly adjacent to the gate material 212, and are in turn surrounded by interfacial layers 214(1)-214(3).

Instead of the bulk silicon substrate 118, the GAA transistor 200 uses a SOI substrate 218, formed from an insulator layer 218A and a substrate 218B. The insulator layer 218A may be a silicon oxide material, and the substrate 218B may be silicon (Si), silicon-germanium (SiGe), or some other semiconductor material without departing from the present disclosure. The substrate 218B has a top surface 220 that extends in a plane along the X and Z axes. The insulator layer 218A is positioned above and on the top surface 220 of the substrate 218B and is, in a first exemplary aspect, coextensive with the substrate 218B such that the entirety of the top surface 220 is formed from the insulator layer 218A. In a second exemplary aspect, the insulator layer 218A may have a footprint approximately the same as the footprint of a channel 210 (shown by dotted lines 218A'). The gate and channel stack of the GAA transistor 200 is positioned above and on the insulator layer 218A and may be considered to have a vertical axis (i.e., the Y-axis) orthogonal to the plane of the top surface 220, a lateral axis (i.e., the X-axis) parallel to the plane of the top surface 220, and a longitudinal axis (i.e., the Z-axis) parallel to the plane (and perpendicular to the lateral axis).

The gate material 212 of the GAA transistor 200 may be conceptualized as a bottom section 222, a middle section 224, and a top section 226. It should be appreciated that more (or fewer, as long as there is at least a bottom section 222 positioned vertically between the bottom nanostructure 206(3) and the insulator layer 218A) sections may be present in the GAA transistor 200 without departing from the present disclosure. In addition to the interfacial layers 214(1)-214(3) and the high-K dielectric material layers 216(1)-216(3), the sections 222, 224, 226 may further have insulating material 228 between the interfacial layers 214(1)-

214(3) and the nanostructures 206(1)-206(3). The nanostructures 206(1)-206(3) extend into a source region 230 and a drain region 232 similar to the GAA transistor 100.

The bottom section 222 may have a gate length 222L extending along the Z-axis (i.e., a longitudinal axis) that is between eight and twenty (8-20) nm and more practically between twelve and sixteen (12-16) nm. The bottom section 222 may also have thickness 222T along the vertical axis (i.e., Y-axis). While the dimensions of the bottom section 222 are specifically discussed, it should be appreciated that the other sections 224, 226 may have comparable dimensions.

In addition to the nanostructures 206(1)-206(3) positioned above the top surface 220, exemplary aspects of the present disclosure provide an additional nanostructure 234 positioned between the bottom section 222 and the insulator layer 218A. The additional nanostructure 234 is referred to herein as a bottom channel and has a thickness 234T along the vertical axis (Y-axis). In an exemplary aspect, the thickness 234T is less than or equal to one third of the gate length 222L. Said another way, the gate length 222L is at least three times greater than the bottom channel thickness 234T. The bottom channel thickness 234T may also be less than the channel thickness 210T(3). Note that it is expected that channel thicknesses 210T(1)-210T(3) are substantially identical, and thus, the bottom channel thickness 234T is the thinnest of the any of the channels. However, even if the channel thicknesses 210T(1)-210T(3) vary, the bottom channel thickness 234T is still the thinnest, being thinner than any of the other channels present in the GAA transistor 200. The nanostructure 234 may also have a bottom channel length 234L that is the same as the channel length 210L(1)-210L(3).

By adding the bottom channel 234 as well as the insulator layer 218A, the distance d' between the gate material 212 and the conductive portion of the substrate is increased. Referring back to Equation 1, as d increases, the capacitance decreases. Thus, the addition of the bottom channel 234 helps reduce the parasitic capacitance. Further, since the gate material 212 does not surround the bottom channel 234, there is less of an electric field from the gate material 212 operating on the bottom channel 234 resulting in less control of the bottom channel 234. Accordingly, the bottom channel thickness 234T is chosen relative to the gate length 222L and the channel thickness 210T(3) to provide appropriate control over the bottom channel 234.

It should be appreciated that the nanostructure 234 is a functional channel with good drive current, reduced leakage, and reduced parasitic capacitance for the resulting GAA transistor 200.) The resulting GAA transistor 200 may be incorporated into an IC where only one or a few of the transistors within the IC are GAA transistors 200 up through an IC where all of the transistors therein are GAA transistors 200. That is, an IC may be made having one, some, or all transistors made according to the present disclosure.

Figure 3:
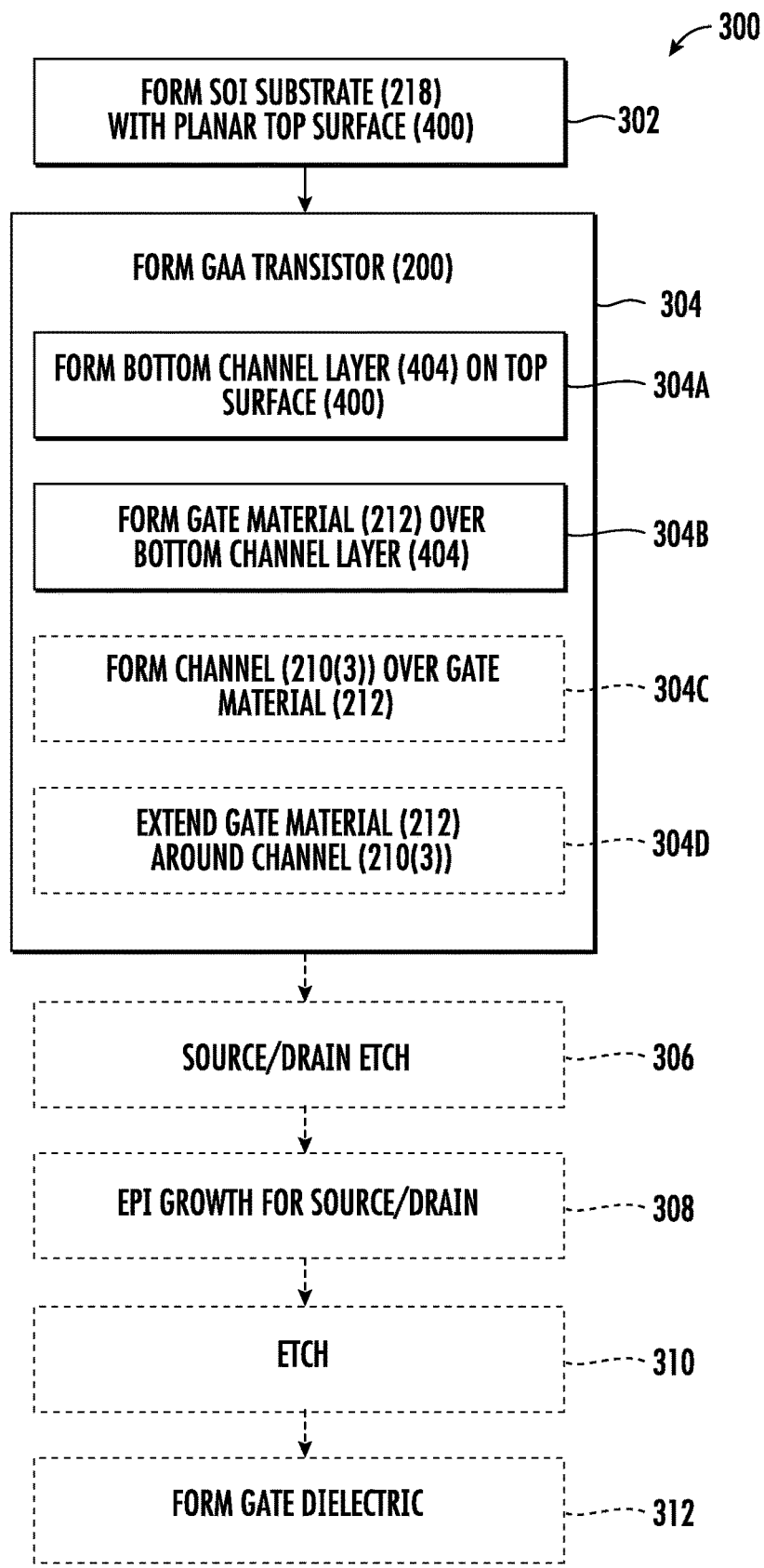
FIG. 3 is a flowchart illustrating an exemplary process for manufacturing the GAA transistor device of FIG. 2.

FIG. 3 provides a flowchart of a process 300 associated with fabricating the GAA transistor 200 of FIG. 2 while FIGS. 4A-4I provide cross-sectional views of the product of the process 300 at different fabrication stages of the process 300 as noted. In particular, the process 300 highlights the addition of the bottom channel 234 that helps reduce parasitic capacitance between the substrate 218 and the bottom section 222 in the GAA transistor 200.

In this regard, the process 300 begins by forming the SOI substrate 218 with a planar top surface (block 302). Note that not only does the substrate 218B have the top surface 220, but also the insulator layer 218A has a planar top surface 400 of intermediate product 402 (see FIG. 4A) parallel to the top surface 220. The GAA transistor 200 is then formed (block 304) on top of the insulator layer 218A, where on top of in this context means on the planar top surface 400 in the Y-axis direction.

Figure 4A:
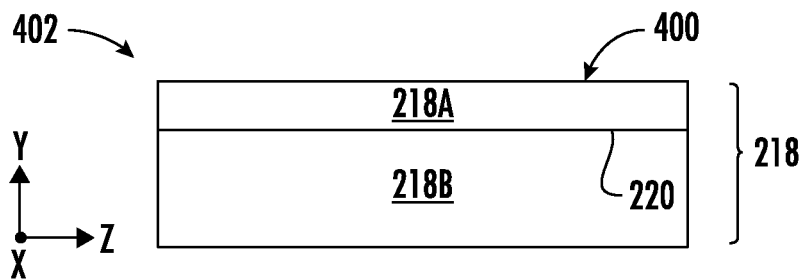
Figure 4B:
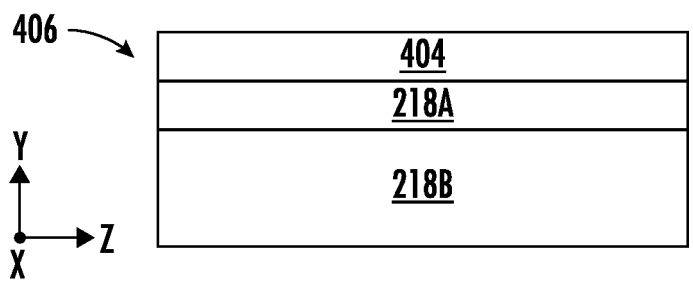

Forming the GAA transistor 200 may be broken down into substeps including forming a bottom channel layer 404 on the top surface 400 (block 304A) to form intermediate product 406 (see FIG. 4B). Use of the bottom channel 234 that will be formed from the bottom channel layer 404 helps space the gate material 212 (applied in the next step) from the substrate 218B, which increases d' of FIG. 2, and correspondingly decreases the capacitance therebetween. Initially, the bottom channel layer 404 may be coextensive with the planar top surface 400, but may be cut to an appropriate length and thickness as well as ground to an appropriate thickness to form the bottom channel 234. For example, the thickness 234T of the bottom channel layer 404 may be approximately three to seven (3-7) nm and the length 234L may be approximately 8-20 nm.

Figure 4C:
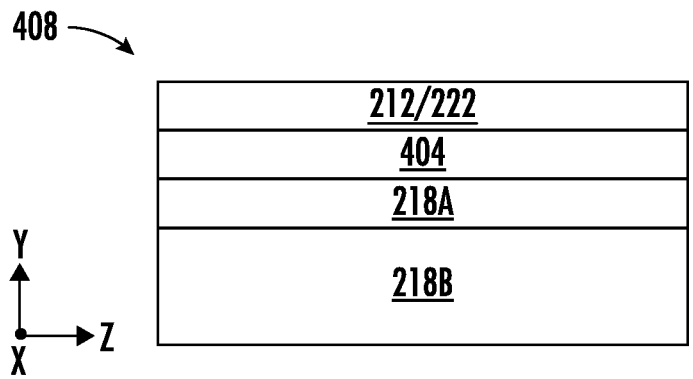

Gate material 212, and particularly the bottom section 222, is then formed over the bottom channel layer 404 (block 304B) to form intermediate product 408 (see FIG. 4C). A recess may be etched into the gate material 212 and lined with interfacial layers 214, dielectric material layers 216, and additional insulating material 228 as is well known. Note that in some processes, the space that the gate material 212 occupies may initially filled by a sacrificial material.

Figure 4D:
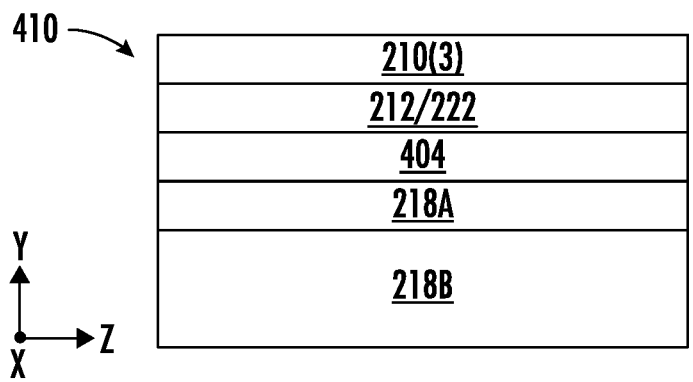

A channel 210(3) is formed over the gate material 212 (and in the recess) (block 304C) to form intermediate product 410 (see FIG. 4D). Additional interfacial layers 214, dielectric material layers 216, and insulating material 228 may be applied to surround the channel 210(3). Additional gate material 212 is applied so as to extend the gate material 212 around the channel 210(3) (block 304D). Steps 304C and 304D may be repeated until an appropriate gate/channel stack is created (e.g., bottom channel plus three channels). Completion of the repetition results in intermediate product 412 (see FIG. 4E). The intermediate product 412 is then etched to form source/drain recesses 414 to form intermediate product 416 (block 306) as shown in FIG. 4F. Source and drain regions are then grown through an epitaxial growth process (block 308) to form intermediate product 418 as shown in FIG. 4G. Another etch is performed (block 310) to form intermediate product 420 as shown in FIG. 4H, and the gate dielectric is formed (block 312) to form the finished product 422 (see FIG. 4I).

The GAA transistor devices according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 5 illustrates an example of a processor-based system 500 that can include GAA transistors such as that illustrated in FIG. 2. In this example, the processor-based system 500 includes a processor 502 that includes one or more CPUs 504. The processor 502 may have cache memory 506 coupled to the CPU(s) 504 for rapid access to temporarily stored data. The cache memory 506 may include GAA transistors 508 such as the GAA transistor 200. The processor 502 is coupled to a system bus 510 and can intercouple master and slave devices included in the processor-based system 500. As is well known, the processor 502 communicates with these other devices by exchanging address, control, and data information over the system bus 510. Although not illustrated in FIG. 5, multiple system buses 510 could be provided, wherein each system bus 510 constitutes a different fabric. For example, the processor 502 can communicate bus transaction requests to a memory system 512 as an example of a slave device. The memory system 512 may include memory structures or arrays that include GAA transistors 514.

Other master and slave devices can be connected to the system bus 510. As illustrated in FIG. 5, these devices can include the memory system 512, one or more input devices 516, which can include GAA transistors 518. The input device(s) 516 can include any type of input device, including but not limited to input keys, switches, voice processors, etc. These devices can also include one or more output devices 520, and one or more network interface devices 522, which can include GAA transistors 524. The output device(s) 520 can include any type of output device, including but not limited to audio, video, other visual indicators, etc. These devices can also include one or more display controllers 526, including GAA transistors 528. The network interface device(s) 522 can be any devices configured to allow exchange of data to and from a network 530. The network 530 can be any type of network, including but not limited to a wired or wireless network, a private or public network, a local area network (LAN), a wireless local area network (WLAN), a wide area network (WAN), a BLUETOOTH™ network, and the Internet. The network interface device(s) 522 can be configured to support any type of communications protocol desired.

The processor 502 may also be configured to access the display controller(s) 526 over the system bus 510 to control information sent to one or more displays 532. The display controller(s) 526 sends information to the display(s) 532 to be displayed via one or more video processors 534, which process the information to be displayed into a format suitable for the display(s) 532. The video processor(s) 534 can include GAA transistors 536. The display(s) 532 can include any type of display, including but not limited to a cathode ray tube (CRT), a liquid crystal display (LCD), a plasma display, a light emitting diode (LED) display, etc.

Figure 6:
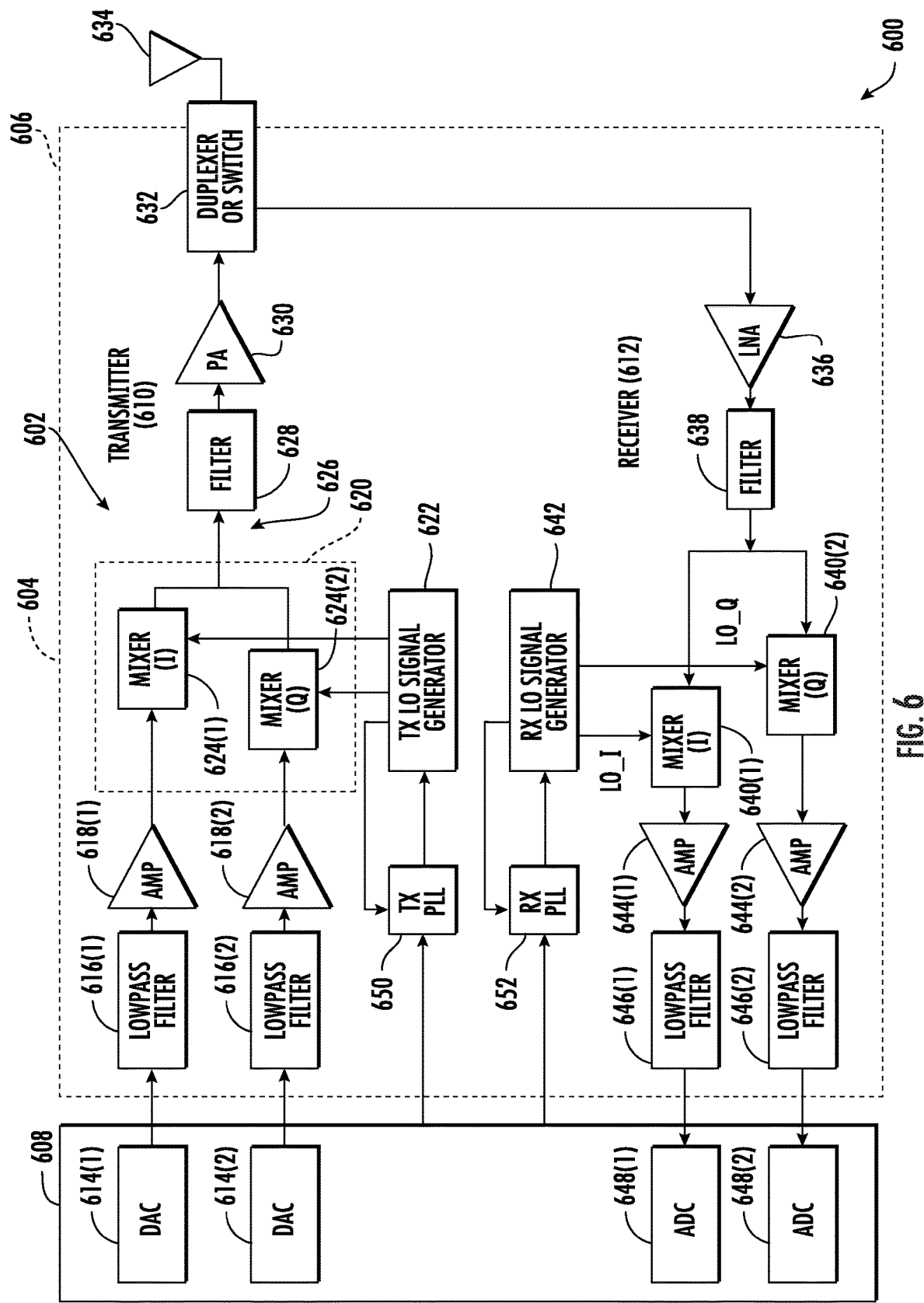
FIG. 6 is a block diagram of an exemplary wireless communications device that includes radio frequency (RF) components formed from an IC, wherein any of the components therein can include ICs that include a GAA transistor device(s) such as the GAA transistor device of FIG. 2.

FIG. 6 illustrates an example of a wireless communications device 600 which can include RF components in which a GAA transistor may be included. The wireless communications device 600 may include or be provided in any of the above referenced devices, as examples. As shown in FIG. 6, the wireless communications device 600 includes a transceiver 604 and a data processor 608. The data processor 608 may include a memory (not shown) to store data and program codes. The transceiver 604 includes a transmitter 610 and a receiver 612 that support bi-directional communication. In general, the wireless communications device 600 may include any number of transmitters and/or receivers for any number of communication systems and frequency bands. All or a portion of the transceiver 604 may be implemented on one or more analog ICs, RF ICs (RFICs), mixed-signal ICs, etc.

A transmitter 610 or a receiver 612 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 612. In the direct-conversion architecture, a signal is frequency converted between RF and baseband in one stage. The super-heterodyne and direct-conversion architectures may use different circuit blocks and/or have different requirements. In the wireless communications device 600 in FIG. 6, the transmitter 610 and the receiver 612 are implemented with the direct-conversion architecture.

In the transmit path, the data processor 608 processes data to be transmitted and provides I and Q analog output signals to the transmitter 610. In the exemplary wireless communications device 600, the data processor 608 includes digital-to-analog-converters (DACs) 614(1) and 614(2) for converting digital signals generated by the data processor 608 into the I and Q analog output signals, e.g., I and Q output currents, for further processing.

Within the transmitter 610, lowpass filters 616(1), 616(2) filter the I and Q analog output signals, respectively, to remove undesired images caused by the prior digital-to-analog conversion. Amplifiers (AMP) 618(1), 618(2) amplify the signals from the lowpass filters 616(1), 616(2), respectively, and provide I and Q baseband signals. An upconverter 620 upconverts the I and Q baseband signals with I and Q transmit (TX) local oscillator (LO) signals through mixers 624(1), 624(2) from a TX LO signal generator 622 to provide an upconverted signal 626. A filter 628 filters the upconverted signal 626 to remove undesired images caused by the frequency upconversion as well as noise in a receive frequency band. A power amplifier (PA) 630 amplifies the upconverted signal 626 from the filter 628 to obtain the desired output power level and provides a transmit RF signal. The transmit RF signal is routed through a duplexer or switch 632 and transmitted via an antenna 634.

In the receive path, the antenna 634 receives signals transmitted by base stations and provides a received RF signal, which is routed through the duplexer or switch 632 and provided to a low noise amplifier (LNA) 636. The duplexer or switch 632 is designed to operate with a specific RX-to-TX duplexer frequency separation, such that RX signals are isolated from TX signals. The received RF signal is amplified by the LNA 636 and filtered by a filter 638 to obtain a desired RF input signal. Downconversion mixers 640(1), 640(2) mix an output of the filter 638 with I and Q receive (RX) LO signals (i.e., LO_I and LO_Q) from an RX LO signal generator 642 to generate I and Q baseband signals. The I and Q baseband signals are amplified by amplifiers 644(1), 644(2) and further filtered by lowpass filters 646(1), 646(2) to obtain I and Q analog input signals, which are provided to the data processor 608. In this example, the data processor 608 includes analog-to-digital-converters (ADCs) 648(1), 648(2) for converting the analog input signals into digital signals to be further processed by the data processor 608.

In the wireless communications device 600 in FIG. 6, the TX LO signal generator 622 generates the I and Q TX LO signals used for frequency upconversion, while the RX LO signal generator 642 generates the I and Q RX LO signals used for frequency downconversion. Each LO signal is a periodic signal with a particular fundamental frequency. A transmit (TX) phase-locked loop (PLL) circuit 650 receives timing information from data processor 608 and generates a control signal used to adjust the frequency and/or phase of the TX LO signals from the TX LO signal generator 622. Similarly, a receive (RX) phase-locked loop (PLL) circuit 652 receives timing information from the data processor 608 and generates a control signal used to adjust the frequency and/or phase of the RX LO signals from the RX LO signal generator 642.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC), comprising:
   a substrate comprising a top surface extending in a plane;
   an insulator layer positioned above and on the top surface of the substrate; and
   a gate-all-around (GAA) transistor, the GAA transistor positioned above and on the insulator layer, the GAA transistor having a vertical axis orthogonal to the plane, a lateral axis parallel to the plane, and a longitudinal axis parallel to the plane, the GAA transistor comprising:
      a first channel having a primary axis along the longitudinal axis, the first channel extending parallel to the plane and positioned above the top surface of the substrate, the first channel comprising:
         a first thickness along the vertical axis;
         a plurality of sides parallel to the primary axis; and
         a perimeter formed from the plurality of sides parallel to the primary axis of the first channel;
      a gate extending around the perimeter of the first channel, the gate comprising a bottom section, the bottom section of the gate positioned vertically between the first channel and the insulator layer, the bottom section having a gate length parallel to the longitudinal axis; and
      a nanostructure comprising a bottom channel between the bottom section of the gate and the insulator layer, the nanostructure having a thickness along the vertical axis, the thickness less than or equal to one third of the gate length, the thickness of the nanostructure less than the first thickness.

2. The IC of claim 1, wherein the bottom channel comprises a nanoslab.

3. The IC of claim 1, wherein the first channel comprises a nanoslab.

4. The IC of claim 1, further comprising a plurality of channels positioned above the first channel.

5. The IC of claim 1, wherein the bottom channel is fully depleted.

6. The IC of claim 1, wherein the gate length is between eight and twenty nanometers (8-20 nm).

7. The IC of claim 1, wherein the gate length is between twelve and sixteen nanometers (12-16 nm).

8. The IC of claim 1, wherein the thickness of the bottom channel is between three and seven nanometers (3-7 nm).

9. The IC of claim 1, further comprising a source region and a drain region, both the source region and the drain region coupled to the first channel.

10. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. An integrated circuit (IC), comprising:
a substrate comprising a top surface extending in a plane;
an insulator layer positioned above and on the top surface of the substrate; and
a gate-all-around (GAA) transistor, the GAA transistor positioned above and on the insulator layer, the GAA transistor having a vertical axis orthogonal to the plane, a lateral axis parallel to the plane, and a longitudinal axis parallel to the plane, the GAA transistor comprising:
a first channel having a primary axis along the longitudinal axis, the first channel extending parallel to the plane and positioned above the top surface of the substrate, the first channel comprising:
a first thickness along the vertical axis;
a plurality of sides parallel to the primary axis; and
a perimeter formed from the plurality of sides parallel to the primary axis of the first channel;
a gate extending around the perimeter of the first channel, the gate comprising a bottom section, the bottom section of the gate positioned vertically between the first channel and the insulator layer; and
a bottom channel between the bottom section of the gate and the insulator layer, the bottom channel having a bottom channel thickness along the vertical axis, the bottom channel thickness less than the first thickness.

12. The IC of claim 11, wherein the bottom channel comprises a nanoslab.

13. The IC of claim 11, wherein the first channel comprises a nanoslab.

14. The IC of claim 11, further comprising a plurality of channels positioned above the first channel.

15. The IC of claim 11, wherein the bottom channel is fully depleted.

16. The IC of claim 11, wherein the bottom section has a gate length parallel to the longitudinal axis and the gate length is between eight and twenty nanometers (8-20 nm).

17. The IC of claim 16, wherein the gate length is between twelve and sixteen nanometers (12-16 nm).

18. The IC of claim 11, wherein the bottom channel thickness is between one and three nanometers (1-3 nm) less than the first thickness.

19. The IC of claim 11, further comprising a source region and a drain region, both the source region and the drain region coupled to the first channel.

20. The IC of claim 11, wherein the insulator layer has horizontal dimensions substantially equal to horizontal dimensions of the first channel.

21. The IC of claim 11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

22. A method of forming an integrated circuit (IC), comprising:
forming a substrate with an insulator layer, the insulator layer having a planar top surface extending in a plane; and
forming a gate-all-around (GAA) transistor, the GAA transistor positioned above and on the top surface of the insulator layer, the GAA transistor having a vertical axis perpendicular to the plane, a lateral axis parallel to the plane, and a longitudinal axis parallel to the plane, wherein forming the GAA transistor comprises:
forming a bottom channel on the top surface of the insulator layer, the bottom channel having a bottom thickness;
forming a gate over the bottom channel, the gate having a gate length, wherein the gate length is at least three times greater than the bottom thickness; and
forming a first channel over the gate, the first channel having a first thickness greater than the bottom thickness.

23. The method of claim 22, wherein forming the bottom channel comprises forming the bottom channel having the bottom thickness of between three and seven nanometers (3-7 nm).

24. A method of forming an integrated circuit (IC), comprising:
forming a substrate with an insulator layer, the insulator layer having a planar top surface extending in a plane; and
forming a gate-all-around (GAA) transistor, the GAA transistor positioned above and on the top surface of the insulator layer, the GAA transistor having a vertical axis perpendicular to the plane, a lateral axis parallel to the plane, and a longitudinal axis parallel to the plane, wherein forming the GAA transistor comprises:
forming a bottom channel on the top surface of the insulator layer, the bottom channel having a bottom thickness;
forming a gate over the bottom channel; and
forming a first channel over the gate, the first channel having a first thickness greater than the bottom thickness.

* * * * *